US009071250B2

(12) United States Patent
Okano

(10) Patent No.: US 9,071,250 B2
(45) Date of Patent: Jun. 30, 2015

(54) SEMICONDUCTOR INTEGRATED CIRCUIT AND CONTROL METHOD FOR THE SAME

(71) Applicant: FUJITSU LIMITED, Kawasaki-shi, Kanagawa (JP)

(72) Inventor: Hiroshi Okano, Hachioji (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/060,204

(22) Filed: Oct. 22, 2013

(65) Prior Publication Data

US 2014/0049316 A1 Feb. 20, 2014

Related U.S. Application Data

(63) Continuation of application No. PCT/JP2011/060596, filed on May 6, 2011.

(51) Int. Cl.
*G05F 1/10* (2006.01)
*H03L 5/00* (2006.01)
*G06F 1/26* (2006.01)
*G06F 1/28* (2006.01)

(52) U.S. Cl.
CPC .. *H03L 5/00* (2013.01); *G06F 1/26* (2013.01); *G06F 1/28* (2013.01)

(58) Field of Classification Search
USPC .............................. 327/534–544, 551, 362, 99
See application file for complete search history.

(56) References Cited

U.S. PATENT DOCUMENTS

| 6,057,729 | A | 5/2000 | Nomura |
| 6,429,693 | B1 | 8/2002 | Staszewski et al. |
| 8,046,609 | B2 * | 10/2011 | Kawasaki ............... 713/300 |
| 8,063,517 | B2 * | 11/2011 | Bott et al. ............ 310/12.14 |
| 2008/0177488 | A1 | 7/2008 | Niitsuma et al. |
| 2009/0072885 | A1 | 3/2009 | Kawasaki |
| 2009/0091370 | A1 | 4/2009 | Kawasaki |
| 2010/0321060 | A1 | 12/2010 | Nishio et al. |

FOREIGN PATENT DOCUMENTS

| JP | 1999-007330 | 1/1999 |
| JP | 2002-076886 | 3/2002 |
| JP | 2007-293748 | 11/2007 |
| JP | 2008-262370 | 10/2008 |
| JP | 2008-276612 | 11/2008 |
| JP | 2009-094133 | 4/2009 |

(Continued)

OTHER PUBLICATIONS

International Search Report, mailed in connection with PCT/JP2011/060596 and mailed Aug. 9, 2011.
ISR—International Search Report (ISR) and Written Opinion of the International Search Authority (WO/ISA) for PCT/JP2011/060596 mailed on Aug. 9, 2011 with English translation.

(Continued)

*Primary Examiner* — Dinh Le
(74) *Attorney, Agent, or Firm* — Fujitsu Patent Center

(57) ABSTRACT

A semiconductor integrated circuit includes a user circuit and a power supply noise suppression circuit. The user circuit includes a plurality of circuit modules each containing an operation ratio control circuit. The power supply noise suppression circuit judges an amount of current fluctuation occurring in the user circuit by monitoring an operation ratio of each of the plurality of circuit modules, and controls, via each of the operation ratio control circuits, the operation ratio of a corresponding one of the circuit modules in accordance with a result of the judgment of the amount of current fluctuation.

16 Claims, 14 Drawing Sheets

(56) References Cited

FOREIGN PATENT DOCUMENTS

| | | |
|---|---|---|
| JP | 2009-099047 | 5/2009 |
| JP | 2009-188881 | 8/2009 |
| JP | 2011-004038 | 1/2011 |
| WO | 2007/037017 A1 | 4/2007 |
| WO | 2007/108383 A1 | 9/2007 |

OTHER PUBLICATIONS

JPOA—Office Action of JP Patent Application No. 2013-513835 mailed Sep. 9, 2014, with English translation of the relevant part, from p. 1, line 17 to p. 3, line 2, of the Office Action.

* cited by examiner

PERIOD SPECIFIED BY OPERATION RATIO CONTROL
WAVEFORM INFORMATION STORAGE REGISTER

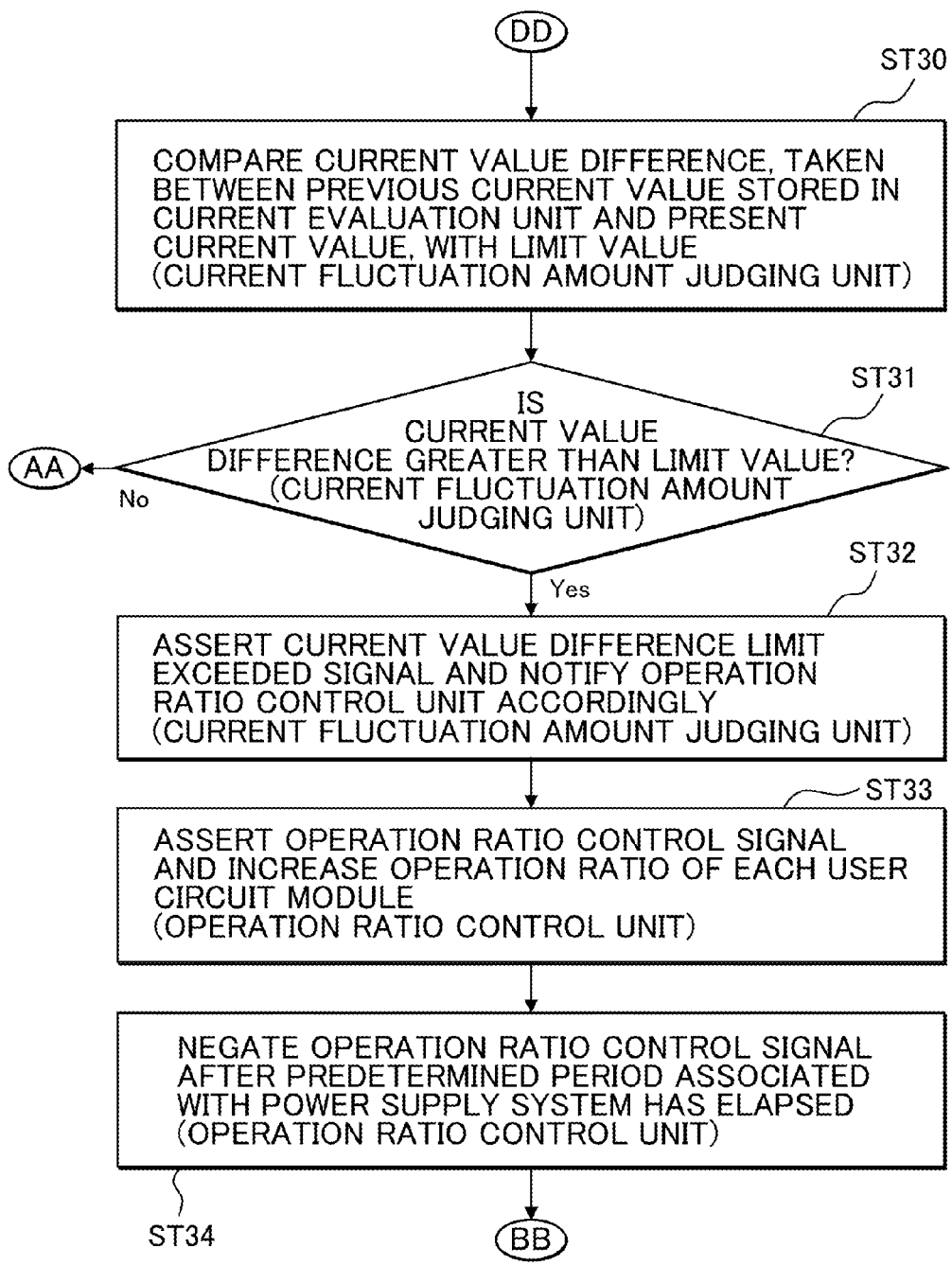

1

SEMICONDUCTOR INTEGRATED CIRCUIT AND CONTROL METHOD FOR THE SAME

CROSS-REFERENCE TO RELATED APPLICATION

This application is a continuation application and is based upon PCT/JP2011/060596, filed on May 6, 2011, the entire contents of which are incorporated herein by reference.

FIELD

The embodiments discussed herein are related to a semiconductor integrated circuit and a control method for the same.

BACKGROUND

In recent years, techniques such as clock gating and RAM macro chip enable control have been employed in semiconductor integrated circuit designs, aiming to reduce power consumption by disabling the portions of the circuit that are not in use and thereby suppressing unnecessary operation of the circuit.

However, when these techniques are applied to reduce power consumption, the difference between the maximum and minimum values of power that the circuit consumes increases, and as a result, the difference between the maximum and minimum values of the current that flows in the circuit also increases. This, for example, may result in increased power supply noise or may lead to malfunction of the circuit, posing a major obstacle to actively incorporating such power reduction techniques in semiconductor integrated circuit designs.

In a power supply system constructed from a die, package, and board, for example, if a current fluctuation (for example, a current fluctuation lower in frequency than about 100 MHz) occurs in a frequency band where the impedance is high, power supply noise increases.

One related art approach to suppressing such power supply noise has been to mount capacitors on the die (chip), package, or board so that the effect of power supply noise may be reduced below a permissible level even if a current fluctuation occurs.

As described above, in the related art, the effect of power supply noise has been be reduced below a permissible level in the event of a current fluctuation, for example, by mounting capacitors on the die, package, or board.

However, with this related art approach, as a lower voltage, larger current design becomes possible with further advances in miniaturization technology, the capacitance of the capacitors to suppress the power supply noise has to be increased, since $\Delta I/\Delta t$ (the amount of current fluctuation per unit time) increases.

This results in increased die size and increased cost due to an increase in the number of capacitors mounted on the package or board. On the other hand, if $\Delta I/\Delta t$ is reduced so as to be able to address the problem with a fewer number of capacitors by giving preference to the cost, limitations may be imposed on the power reduction techniques to be employed in semiconductor integrated circuit designs.

In the related art, various designs have been proposed for semiconductor integrated circuits including power supply noise suppression functions.

Patent document 1: Japanese Laid-open Patent Publication No. 2008-276612

Patent document 2: Japanese Laid-open Patent Publication No. 2009-099047

SUMMARY

According to an aspect of the embodiments, there is provided a semiconductor integrated circuit including a user circuit and a power supply noise suppression circuit. The user circuit is configured to include a plurality of circuit modules each containing an operation ratio control circuit.

The power supply noise suppression circuit is configured to judge an amount of current fluctuation occurring in the user circuit by monitoring an operation ratio of each of the plurality of circuit modules, and is configured to control, via each of the operation ratio control circuits, the operation ratio of a corresponding one of the circuit modules in accordance with a result of the judgment of the amount of current fluctuation.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 10A, FIG. 10B, and FIG. 10C are a flowchart for explaining an alternative example of the processing performed in the semiconductor integrated circuit according to the present embodiment;

DESCRIPTION OF EMBODIMENTS

An embodiment of a semiconductor integrated circuit and a control method for the same will be described below with reference to the accompanying drawings.

Figure 1:
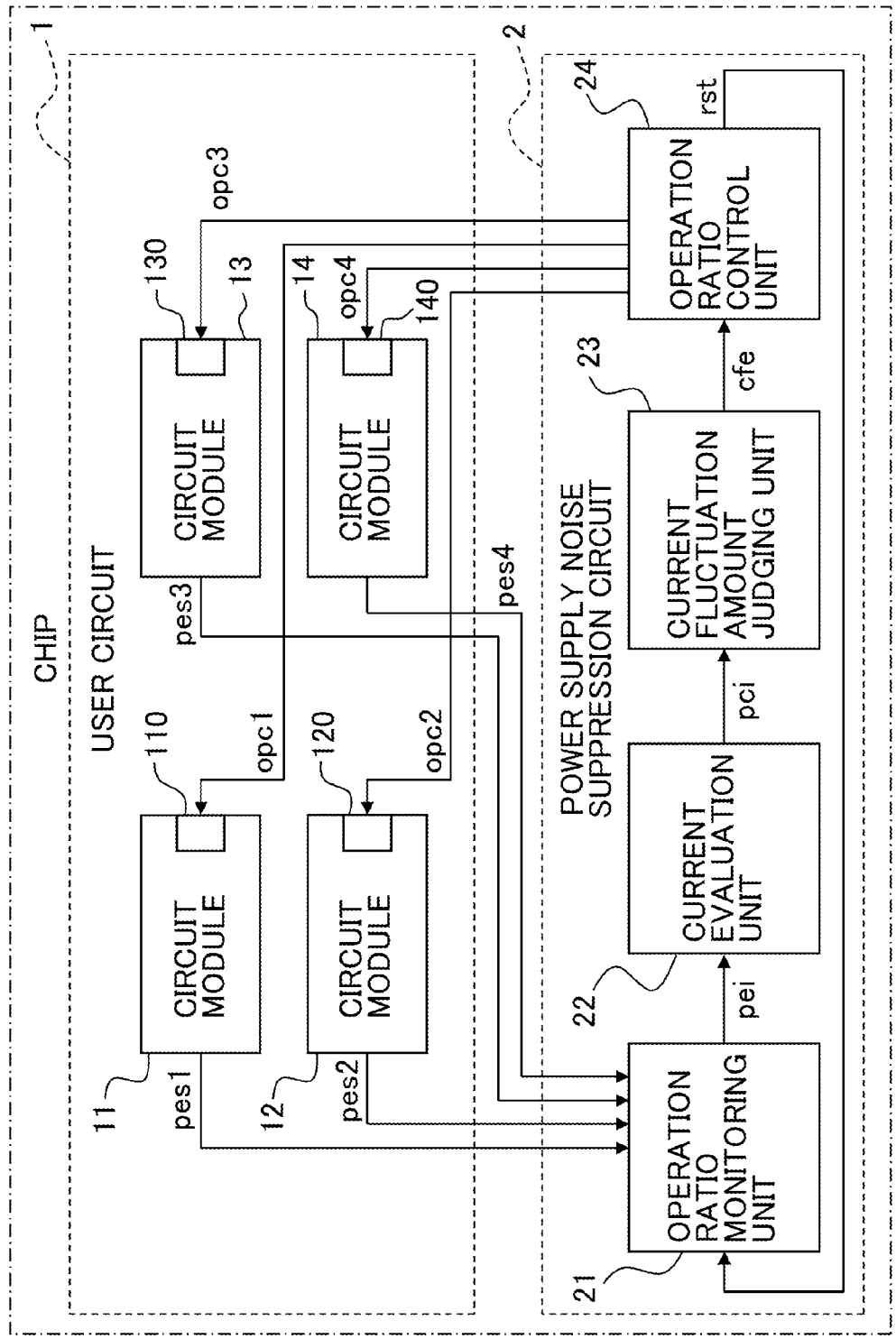
FIG. 1 is a block diagram illustrating one example of a semiconductor integrated circuit according to the present embodiment.

FIG. 1 is a block diagram illustrating one example of the semiconductor integrated circuit according to the present embodiment. As illustrated in FIG. 1, the semiconductor integrated circuit (chip) includes a user circuit 1 and a power supply noise suppression circuit 2.

The user circuit 1 includes a plurality of circuit modules 11, 12, 13, and 14, which contain operation ratio control circuits 110, 120, 130, and 140, respectively.

The chip corresponds, for example, to a processor (CPU: Central Processing Unit), and the user circuit 1 corresponds, for example, to a processor core or a video processing circuit block or the like. The circuit modules 11 to 14 each correspond, for example, to an arithmetic unit, a RAM, or a cache memory unit, and more specifically, to a circuit that performs processing necessary for the chip to accomplish its intended functions.

The user circuit 1 may not be limited to a processor core or a video processing circuit block, and the user circuit 1 may be constructed from the plurality of circuit modules 11 to 14 containing the operation ratio control circuits 110 to 140, respectively.

As illustrated in FIG. 1, the power supply noise suppression circuit 2 includes an operation ratio monitoring unit 21, a current evaluation unit 22, a current fluctuation amount judging unit 23, and an operation ratio control unit 24. The operation ratio monitoring unit 21 receives signals (power estimating signals pes1 to pes4) indicating high correlations with the power values produced during operation of the respective circuit modules 11 to 14 in the user circuit 1, and outputs an operation ratio information signal pei carrying operation ratio information.

The current evaluation unit 22 receives the operation ratio information signal pei from the operation ratio monitoring unit 21, and outputs a current value information signal pci carrying corresponding current value information. The current fluctuation amount judging unit 23 receives the current value information signal pci, and outputs a current fluctuation amount limit exceeded signal cfe indicating that the amount of current fluctuation has exceeded a limit value.

More specifically, the current fluctuation amount judging unit 23 judges whether the width of fluctuation of the current value in a given cycle (for example, a cycle Tr corresponding to the resonant frequency of the power supply system) has exceeded a permissible level, and outputs the current fluctuation amount limit exceeded signal cfe for suppressing the power supply noise that could occur due to the fluctuation of the current value.

The operation ratio control unit 24 receives the current fluctuation amount limit exceeded signal cfe, and supplies operation ratio control signals opc1 to opc4 for controlling the operation ratio to the operation ratio control circuits 110 to 140 in the respective circuit modules 11 to 14. Further, the operation ratio control unit 24 supplies a reset signal rst to the operation ratio monitoring unit 21 to reset the operation ratio monitoring unit 21 upon completion of the operation ratio control.

More specifically, when the width of fluctuation of the current value in a given cycle has exceeded the permissible level, the operation ratio control unit 24 controls the operation ratio control circuits 110 to 140 in the respective circuit modules 11 to 14 so as to shift the cycle of the current fluctuation from the cycle Tr corresponding to the resonant frequency of the power supply system. It thus becomes possible to suppress the power supply noise.

Figure 2A:
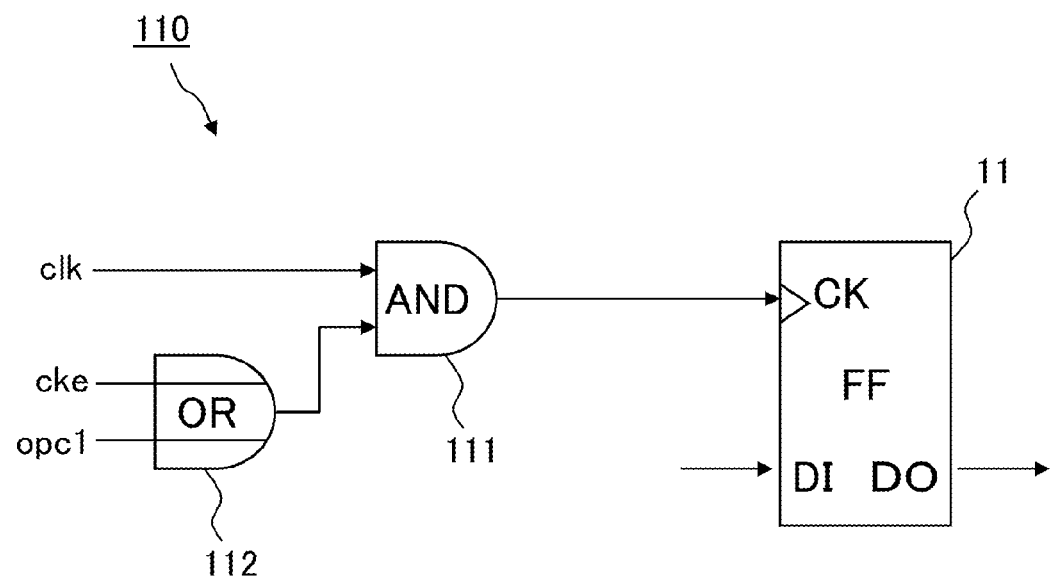
FIG. 2A and FIG. 2B are diagrams illustrating examples of operation ratio control circuits for use in the semiconductor integrated circuit of FIG. 1.
Figure 2B:
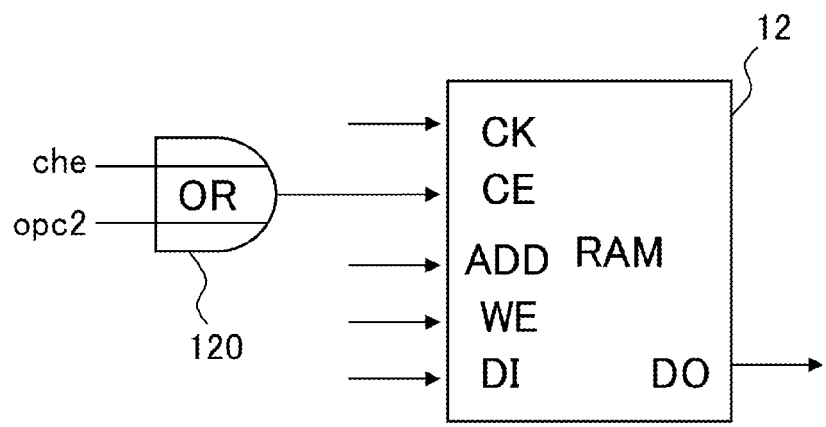

FIG. 2A and FIG. 2B are diagrams illustrating examples of operation ratio control circuits for use in the semiconductor integrated circuit of FIG. 1: FIG. 2A illustrates an operation ratio control circuit that uses clock gating, and FIG. 2B illustrates an operation ratio control circuit that uses RAM chip enable control.

To simplify the explanation, FIG. 2A illustrates the case where the circuit module 11 is a flip-flop FF, while FIG. 2B illustrates the case where the circuit module 12 is a memory (RAM: Random Access Memory).

First, as illustrated in FIG. 2A, the operation ratio control circuit 110 includes an AND gate 111 and an OR gate 112, and controls the flip-flop (circuit module) 11.

The flip-flop 11 latches input data at its DI terminal when the signal at its CK terminal goes to a high level "H". The latched data is output from the DO terminal of the flip-flop 11.

A clock enable signal cke is input to the OR gate 112 along with the operation ratio control signal opc1 from the operation ratio control unit 24, and the output of the OR gate 112 is applied to the AND gate 111 along with a clock signal clk. The output of the AND gate 111 is applied to the clock input CK of the flip-flop 11.

Then, when the output of the AND gate 111 goes to "H", that is, when at least either one of cke and opc1 is "H", and clk changes to "H", the flip-flop 11 latches the input data.

Accordingly, for example, even when the clock enable signal cke is at a low level "L", if (when) the operation ratio control signal opc1 is "H", the flip-flop 11 latches the input data in response to the clock signal clk, and thus consumes a certain amount of power.

Next, as illustrated in FIG. 2B, the operation ratio control circuit 120 is constructed from an OR gate which receives a chip enable signal che along with the operation ratio control signal opc2, and controls the memory (circuit module) 12.

The memory 12 includes a clock terminal CK to which a clock signal clk is applied, a chip enable terminal CE which enables the memory, an address terminal ADD to which an address signal is applied, and a write enable terminal WE to which a write enable signal we is applied. DI designates the terminal that receives write data, and DO the terminal that outputs readout data.

Accordingly, for example, even when the chip enable signal che is at a low level "L", if the operation ratio control signal opc2 is "H", the output "H" of the OR gate 120 is applied to the chip enable terminal CE, and the memory 12 is thus put in an enabled state and consumes a certain amount of power.

In this way, the operation ratio control circuits 110 and 120 depicted in FIG. 2A and FIG. 2B each include a function for controlling (increasing) the operation ratio of the circuit module 11 or 12 in response to the operation ratio control signal opc1 or opc2, respectively.

The circuits illustrated in FIG. 2A and FIG. 2B are examples, and it will be appreciated that various configurations are possible for the circuit modules 11 to 14 and their operation ratio control circuits 110 to 140.

On the other hand, reducing the operation ratio may be accomplished, for example, by lowering the frequency of the clock signal or, in the case of a processor, by reducing the number of instructions to be issued simultaneously or by putting the processor in a wait state and thereby suspending the processing.

Figure 3:
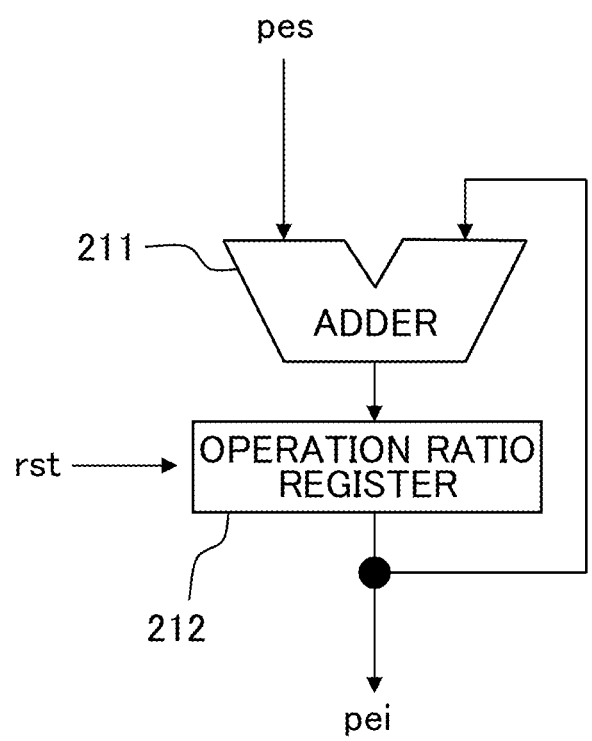
FIG. 3 is a block diagram illustrating one example of an operation ratio monitoring unit in the semiconductor integrated circuit of FIG. 1.

FIG. 3 is a block diagram illustrating one example of the operation ratio monitoring unit in the semiconductor integrated circuit of FIG. 1. As illustrated in FIG. 3, the operation ratio monitoring unit 21 is a circuit that obtains operation ratios from the power estimating signals pes1 to pes4 supplied from the circuit modules 11 to 14 in the user circuit 1, and includes an adder 211 and an operation ratio register 212.

The operation ratio register 212 stores an output of the adder 211. The adder 211 adds the output (the operation ratio information signal pei) of the operation ratio register 212 to the power estimating signal pes (pes1 to pes4), and outputs the sum. The operation ratio register 212 is reset by the reset signal rst from the operation ratio control unit 24 to be described later.

More specifically, the operation ratio register 212 in conjunction with the adder 211 counts the number of cycles in which the power estimating signal pes is "H", for example, during the period of a predetermined number of cycles during which the reset signal rst is negated, and outputs the operation ratio information signal pei.

Various kinds of signals may be used as the power estimating signals pes, i.e., the power estimating signals pes1 to pes4 that the circuit modules 11 to 14 output. More specifically, a pipeline valid signal indicating that valid processing is performed in the pipeline, an arithmetic unit valid signal indicating that an arithmetic operation is performed in the arithmetic unit, etc. may be used as the power estimating signals pes.

It is also possible to use, as the power estimating signals pes, such signals as read or write enable signals indicating that a read or write operation is performed on a register file or a RAM, cache hit (or miss) signals, and the like.

That is, of various signals that may provide information identifying the processing being performed in the user circuit 1, any signal indicating high correlation with the power value may be used as each power estimating signal pes. These signals are extracted, for example, by power analysis, etc. performed at the time of LSI design, and are used in operation.

Figure 4:
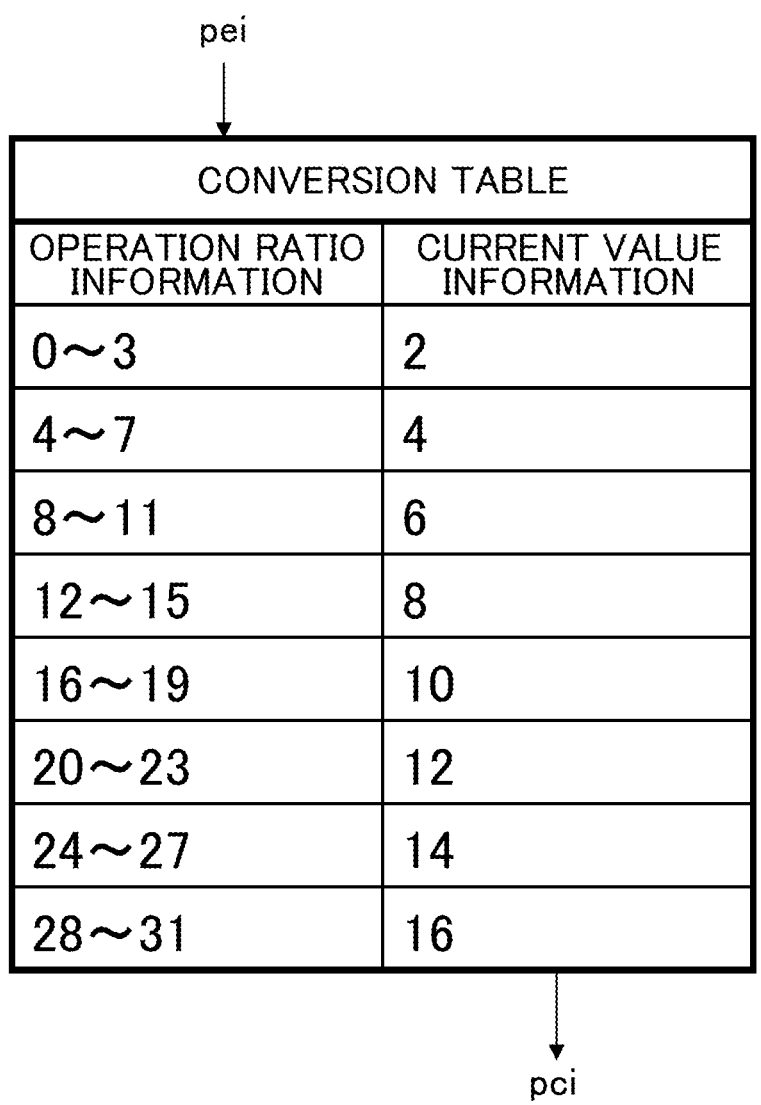
FIG. 4 is a diagram illustrating one example of a current evaluation unit in the semiconductor integrated circuit of FIG. 1.

FIG. 4 is a diagram illustrating one example of the current evaluation unit in the semiconductor integrated circuit of FIG. 1. As illustrated in FIG. 4, the current evaluation unit 22 contains a conversion table that receives the operation ratio information signal pei from the operation ratio monitoring unit 21 and that outputs the corresponding current value information signal pci in response to the operation ratio information signal pei.

The conversion table may be constructed as a fixed table, or alternatively may be constructed as a table whose contents are alterable by software. That is, the conversion table may be constructed from an alterable nonvolatile memory or a memory, such as an e-fuse, that may be altered once.

By thus constructing the table so as to be alterable after fabrication of the chip, if (when) a change is made to the package, etc. after fabrication of the chip, causing the resonant frequency to change, or if a change is made to the operating frequency of the chip, for example, proper control may be performed.

More specifically, as illustrated in FIG. 4, the current evaluation unit 22 receives the operation ratio information signal pei (for example, a count value of 0 to 31), and converts it into the corresponding current value information signal pci of 2, 4, 6, . . . , or 16 in accordance with the conversion table. The operation ratio information signal and the current value information signal are signals that produce higher values as the operation ratio, i.e., the current consumption, increases.

Figure 5:
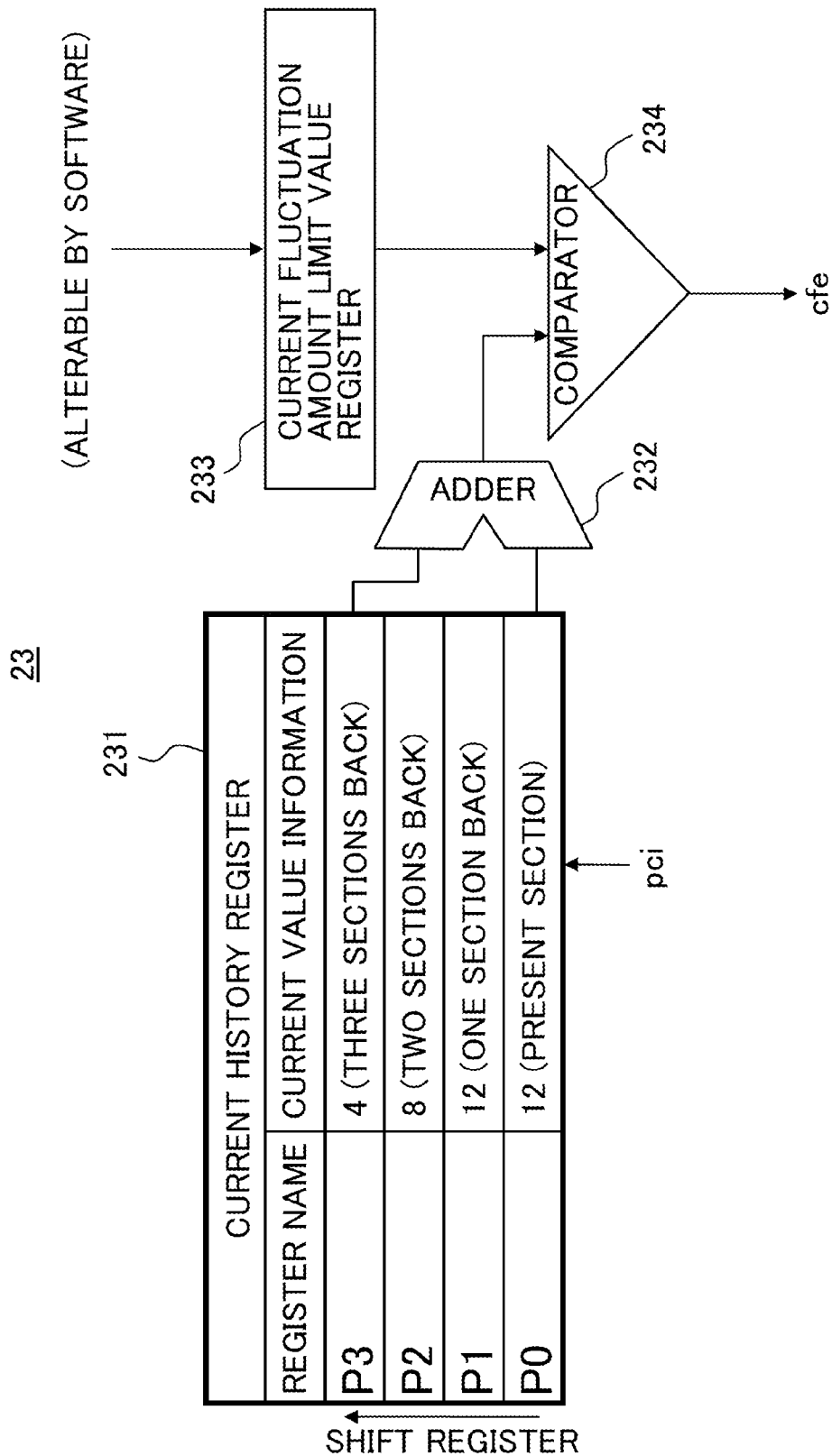
FIG. 5 is a block diagram illustrating one example of a current fluctuation amount judging unit in the semiconductor integrated circuit of FIG. 1.

FIG. 5 is a block diagram illustrating one example of the current fluctuation amount judging unit in the semiconductor integrated circuit of FIG. 1. As illustrated in FIG. 5, the current fluctuation amount judging unit 23 includes a current history register 231, a subtractor (adder) 232, a current fluctuation amount limit value register 233, and a comparator 234.

The current history register 231 is constructed as a shift register including four stages of registers P0 to P3. The register P0 stores the current value information (signal) of the present section, the register P1 stores the current value information one section back, the register P2 stores the current value information two sections back, and the register P3 stores the current value information three sections back.

The subtractor 232 subtracts the current value information (for example, 12) of the current section stored in the register P0 from the current value information three sections back (for example, 4) stored in the register P3, and applies the subtraction result (for example, 4−12=−8) to one input of the comparator 234.

The comparator 234 compares the subtraction result from the subtractor 232 with the value set in the current fluctuation amount limit value register 233, and outputs the current fluctuation amount limit exceeded signal cfe if the subtraction result is larger in magnitude than the set value.

In FIG. 5, the number of registers constituting the current history register 231 (the number of stages in the shift register) is depicted as being four, but to enhance the current measurement accuracy, it is preferable to provide as many registers as possible by considering the resonant frequency of the power supply system and the frequency with which the current history register is updated.

However, since the area size of the current history register, the power consumption overhead, etc. increase as the number of registers in the current history register 231 increases, the actual number of registers is determined by considering the tradeoffs between these factors.

The current value information for each individual circuit module may be stored in the current history register 231, but alternatively, the sum of the current value information from the respective circuit modules may be stored as the current value information representing the power value of the chip as a whole. Further, the current fluctuation amount limit value register 233 may store a predetermined set value, or alternatively may be configured so that the set value may be altered by software in a manner similar to that described earlier.

Figure 6A:
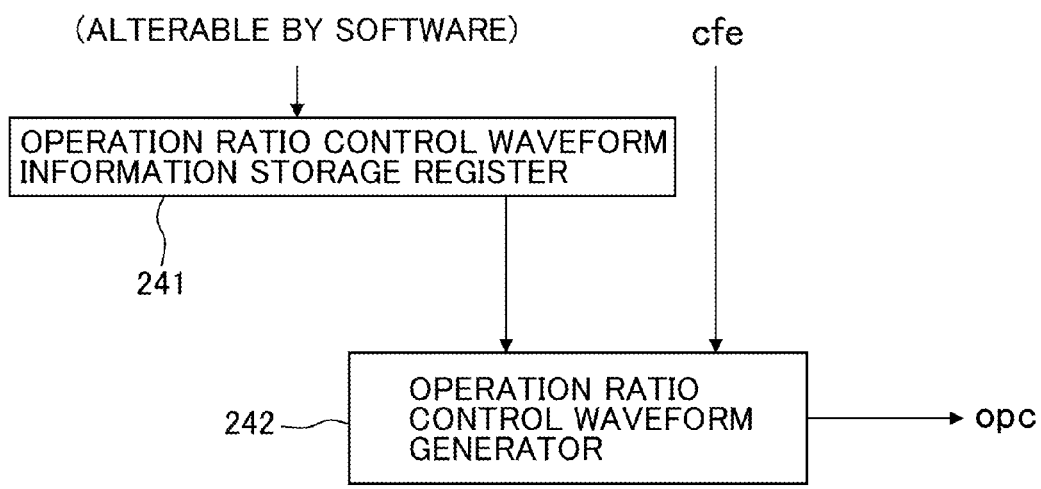
FIG. 6A and FIG. 6B are, respectively, a block diagram illustrating one example of an operation ratio control unit in the semiconductor integrated circuit of FIG. 1, and a diagram for explaining the processing thereof.
Figure 6B:
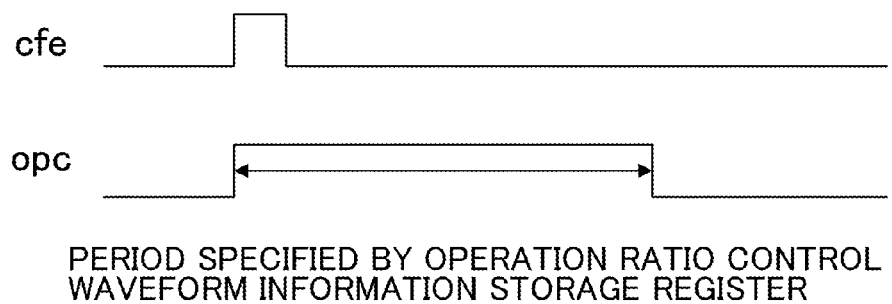

FIG. 6A and FIG. 6B are, respectively, a block diagram illustrating one example of the operation ratio control unit in the semiconductor integrated circuit of FIG. 1, and a diagram for explaining the processing thereof. That is, FIG. 6A is a block diagram illustrating one example of the operation ratio control unit 24, and FIG. 6B is a diagram for explaining the processing for generating the operation ratio control signal opc from the current fluctuation amount limit exceeded signal cfe.

As illustrated in FIG. 6A, the operation ratio control unit 24 includes an operation ratio control waveform information storage register 241 and an operation ratio control waveform generator 242. The operation ratio control waveform information storage register 241 is a register for storing an operation ratio control waveform assertion period.

As illustrated in FIG. 6B, the operation ratio control waveform generator 242 generates the operation ratio control signal opc (opc1 to opc4) by using the current fluctuation amount limit exceeded signal cfe and the contents of the operation ratio control waveform information storage register 241.

More specifically, the operation ratio control signal opc to be output from the operation ratio control unit 24 is driven to a high level "H" by the rising edge of the current fluctuation amount limit exceeded signal cfe and held high "H" (asserted) for the period specified by the operation ratio control waveform information storage register 241.

The period during which the operation ratio control signal opc is asserted is adjusted in advance, for example, to one cycle (Tr) of the resonant frequency of the power supply system. The operation ratio control waveform information to be written to the operation ratio control waveform information storage register 241 may be written to it, for example, by using software.

Figure 7:
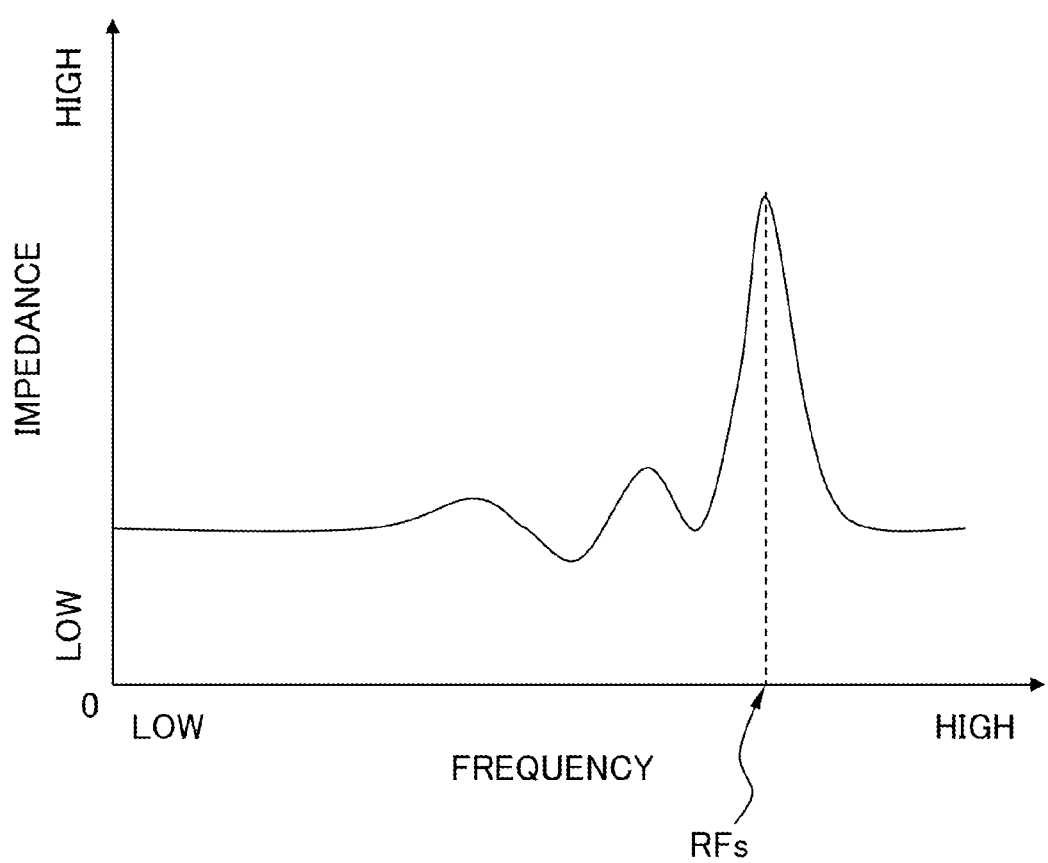
FIG. 7 is a diagram for explaining the frequency dependence of the impedance of a power supply system.

FIG. 7 is a diagram for explaining the frequency dependence of the impedance of the power supply system. The frequency dependence of the impedance of the power supply system constructed from a semiconductor integrated circuit die, package, and board, for example, exhibits a characteristic curve including a plurality of peaks as depicted in FIG. 7, including, as may be seen, the resonant frequency RFs at which the impedance is high.

The resonant frequency RFs of the power supply system appears, for example, in a frequency range lower than 100 MHz, and if a current fluctuation occurs near the resonant frequency RFs, the amount of power supply noise increases. In view of this, the present embodiment reduces the amount of power supply noise by controlling the operation ratio of the user circuit 1 (circuit modules 11 to 14) so that the current fluctuation does not occur near the resonant frequency RFs.

Figure 8:
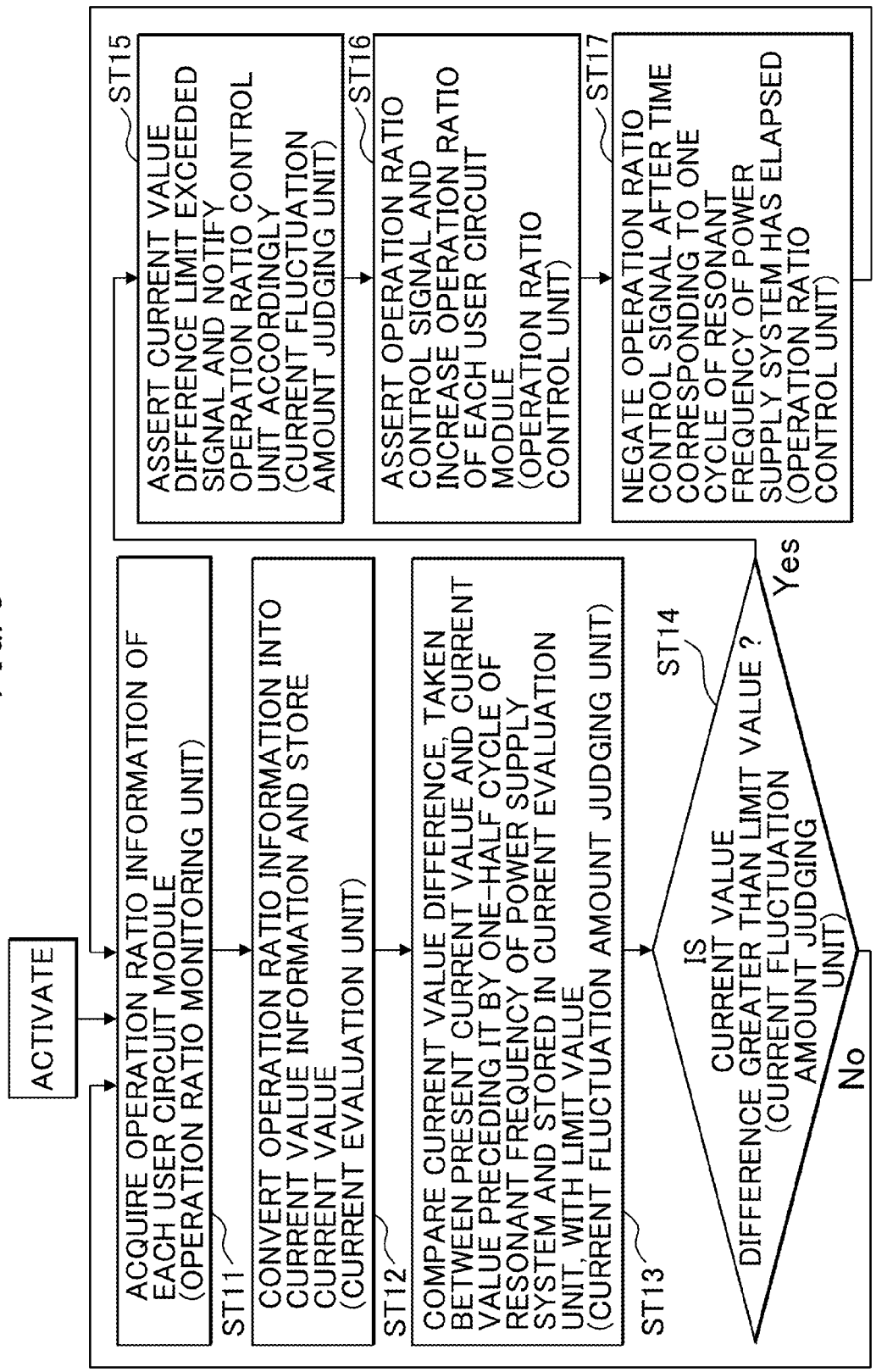
FIG. 8 is a flowchart illustrating one example of the processing performed in the semiconductor integrated circuit according to the present embodiment.
Figure 9A:
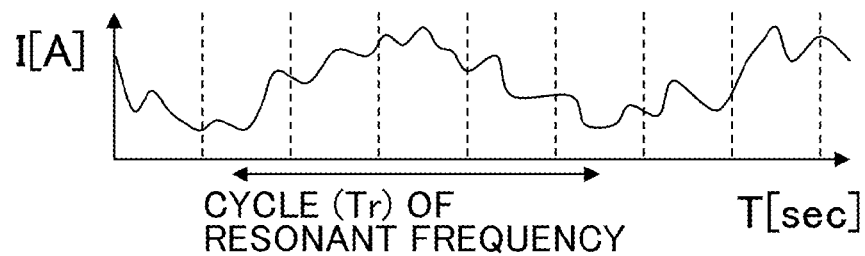
FIG. 9A, FIG. 9B, FIG. 9C, and FIG. 9D are diagrams for explaining the processing illustrated in FIG. 8.

FIG. 8 is a flowchart illustrating one example of the processing performed in the semiconductor integrated circuit according to the present embodiment, and FIG. 9A, FIG. 9B, FIG. 9C, and FIG. 9D are diagrams for explaining the processing illustrated in FIG. 8. It is assumed here that, before the present embodiment is applied, the current is fluctuating with the cycle (Tr) of the resonant frequency of the power supply system, as illustrated in FIG. 9A.

First, as illustrated in FIG. 8, in step ST11 after activation of the chip, the operation ratio monitoring unit 21 receives the power estimating signals pes1 to pes4 from the user circuit modules 11 to 14, and outputs the operation ratio information signal pei associated with the user circuit 1.

Figure 9B:
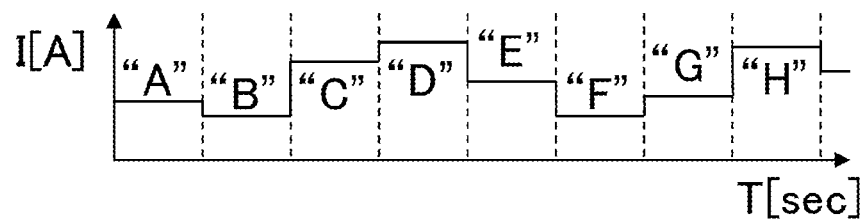

The process then proceeds to step ST12 where the current evaluation unit 22 converts the operation ratio information (pei) into current value information (pci), and stores the current value information signal pci, after which the process proceeds to step ST13. That is, the current evaluation unit 22 converts the operation ratio information signal pei into the current value information signal pci that changes from A to B to C to D, and so on, as illustrated in FIG. 9B, and stores this current value information signal pci.

Figure 9C:
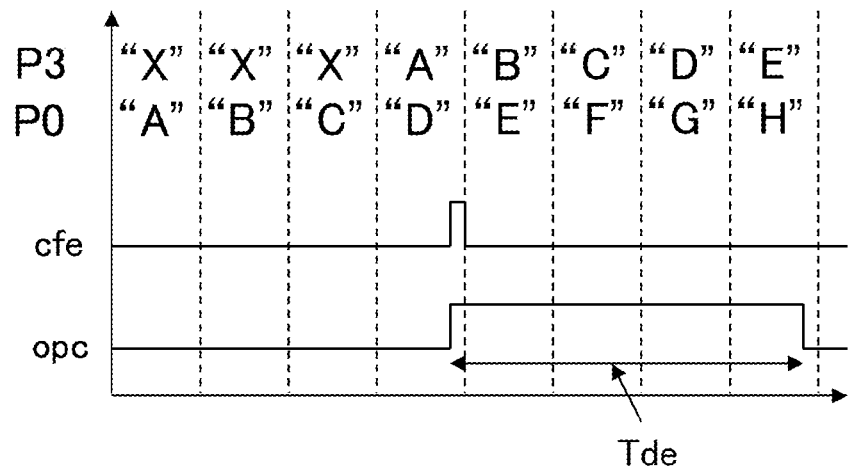

In step ST13, the current fluctuation amount judging unit 23 compares a current value difference, taken between the present current value and the current value preceding it by one-half cycle of the power supply system and stored in the current evaluation unit 22, with the limit value. That is, the current value difference obtained by subtracting the current value information three sections back from the current value information in the present section, for example, as illustrated in FIG. 5, is equal to the current value difference obtained by subtracting the value of the register P0 from the value of the register P3, as illustrated in FIG. 9C, and this current value difference is compared with the prescribed limit value.

Then, the process proceeds to step ST14, and if (when) the current fluctuation amount judging unit 23 determines that the current value difference is not greater than the limit value, the process returns to step ST11 to repeat the above process.

On the other hand, if it is determined in step ST14 that the current value difference is greater than the limit value, the process proceeds to step ST15 where the current fluctuation amount judging unit 23 asserts the current value difference limit exceeded signal cfe and notifies the operation ratio control unit 24 accordingly, after which the process proceeds to step ST16.

In step ST16, the operation ratio control unit 24 asserts the operation ratio control signal opc (opc1 to opc4) for the circuit modules in the user circuit 1 and thereby performs control to increase the circuit operation ratio, after which the process returns to step ST11.

More specifically, FIG. 9C illustrates the situation where the current value difference "A–D" obtained by subtracting the value "D" stored in P0 from the value "A" three sections back stored in P3 exceeds the limit value, causing the current fluctuation amount limit exceeded signal cfe to rise and thus causing the operation ratio control signal opc to be driven to "H" and held at "H" for a prescribed period Tde.

In FIG. 9C, the prescribed period Tde during which the operation ratio control signal opc is held at "H" is equal in duration to the cycle Tr of the resonant frequency, and the clock gating of the circuit module 11, for example, is disabled for the duration of the period Tr (Tde) thereby increasing its operation ratio.

Here, the circuit module (11) whose operation ratio is increased by the operation ratio control signal opc (opc1) may not be limited to one particular circuit module, but a plurality of circuit modules may be controlled simultaneously to increase the operation ratio.

The control performed to increase the operation ratio may be accomplished not only by disabling the clock gating as described above, but also by suppressing the RAM chip enable control described, for example, with reference to FIG. 2B or by applying some other various known techniques.

Figure 9D:
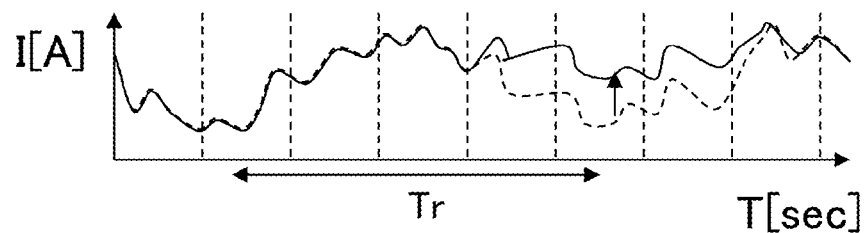

As a result, the operation ratio of the user circuit 1 is prevented from dropping, as illustrated in FIG. 9D; that is, the dashed line in FIG. 9D is raised to the solid line to reduce the current fluctuation, thereby preventing the occurrence of the current fluctuation synchronized to the cycle Tr of the resonant frequency of the power supply system and thus reducing the amount of noise.

Then, the process proceeds to step ST17 where the operation ratio control unit 24 negates the operation ratio control signals opc1 to opc4 after a time corresponding to one cycle of the resonant frequency of the power supply system has elapsed, and thereafter, the process returns to step ST11.

Figure 10A:
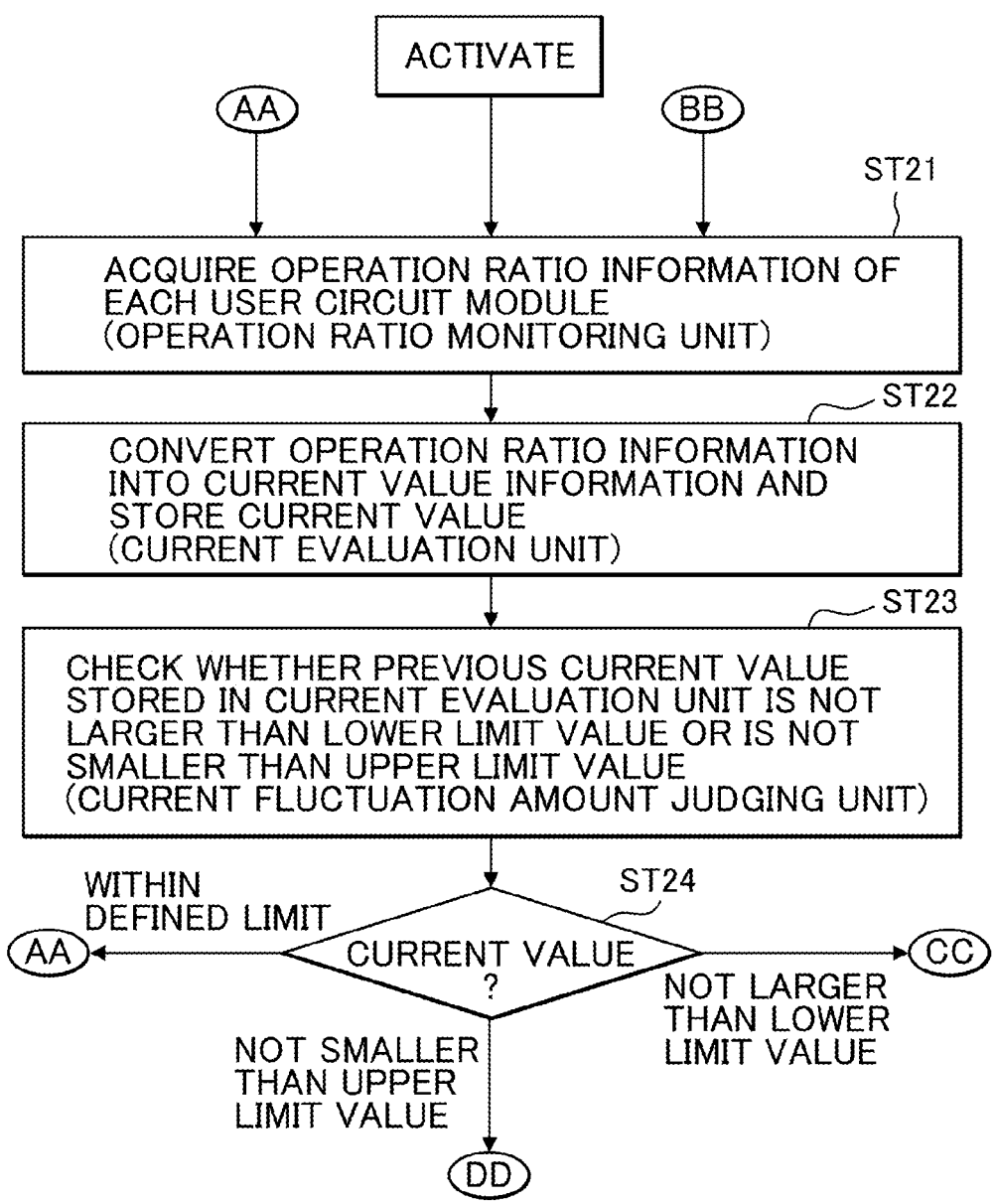
Figure 10B:
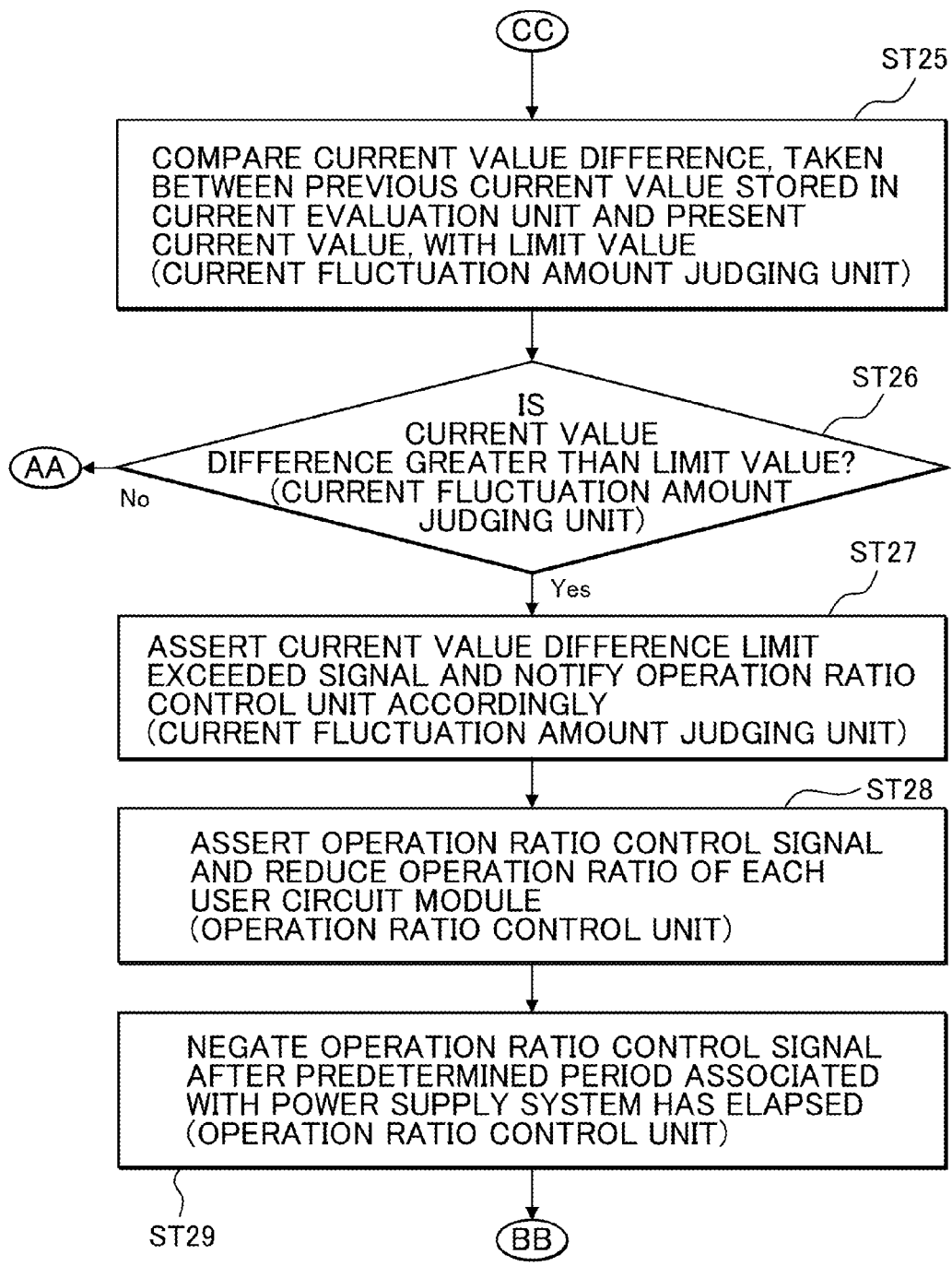

FIG. 10A, FIG. 10B, and FIG. 10C are a flowchart for explaining an alternative example of the processing performed in the semiconductor integrated circuit according to the present embodiment, and FIG. 11A to FIG. 11D and FIG. 12 are diagrams for explaining the processing illustrated in FIG. 10A to FIG. 10C.

Figure 11A:
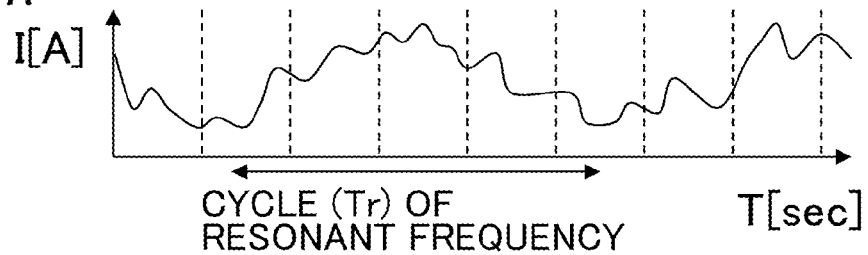
FIG. 11A, FIG. 11B, FIG. 11C, and FIG. 11D are diagrams (part 1) for explaining the processing illustrated in FIG. 10A to FIG. 10C.

In the example illustrated hereinafter with reference to FIG. 10A to FIG. 10C and FIG. 11A to FIG. 11D, limit values are set for both the upper and lower limits, and the operation ratio is controlled by checking whether the previous current value is not larger than the lower limit value or is not smaller than the upper limit value. As in the embodiment previously illustrated with reference to FIG. 8 and FIG. 9A to FIG. 9D, it is also assumed here that, before the present embodiment is applied, the current is fluctuating with the cycle of the resonant frequency of the power supply system, as illustrated in FIG. 11A.

Figure 12:
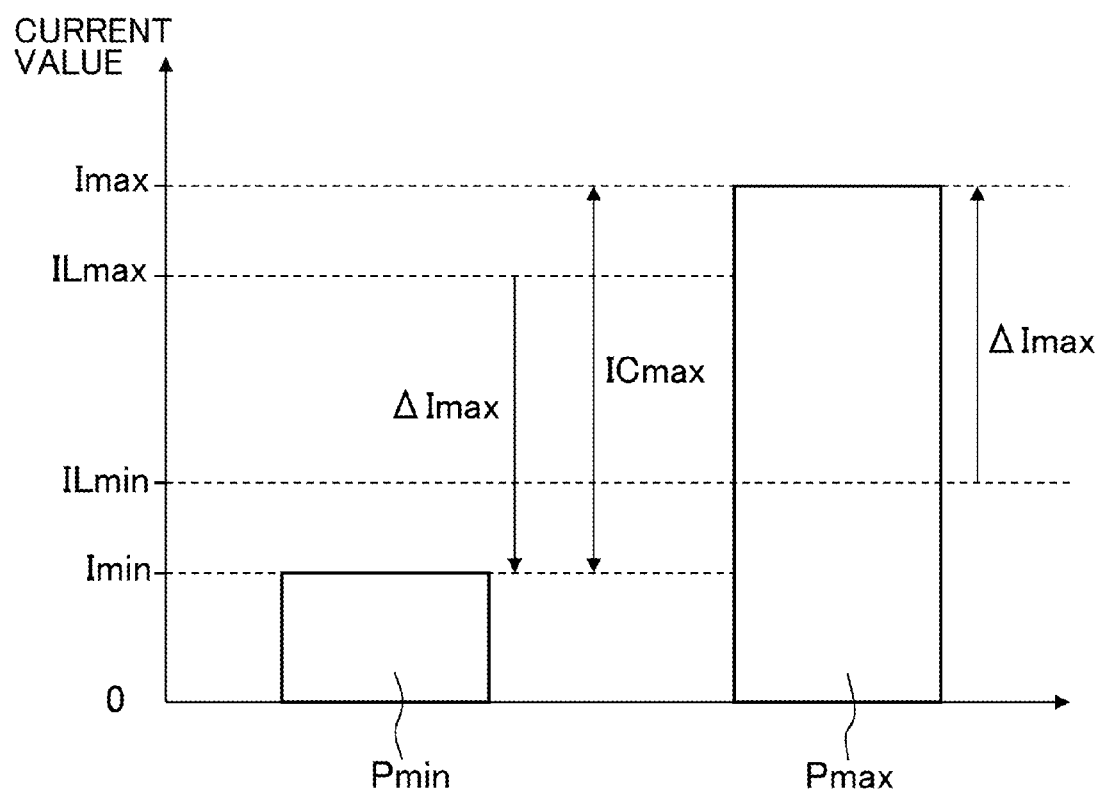
FIG. 12 is a diagram (part 2) for explaining the processing illustrated in FIG. 10A to FIG. 10C.

First, the limit values (the upper and lower limit values) set for the current in the flowchart of FIG. 10A to FIG. 10C will be explained with reference to FIG. 12. In FIG. 12, reference character Imin designates the minimum current value of the semiconductor integrated circuit (LSI), Imax the maximum current value of the LSI, ILmin the limit value defining the lower limit (the lower limit value), and ILmax the limit value defining the upper limit (the upper limit value). Further, reference character ICmax designates the maximum amount of current fluctuation of the LSI, ΔImax the maximum amount of current fluctuation that the power supply system may tolerate, Pmin the minimum power, and Pmax the maximum power.

The LSI is driven at its minimum power Pmin or maximum power Pmax, depending on its operating condition; at the minimum power Pmin, the current value is the minimum current value Imin, while at the maximum power Pmax, the current value is the maximum current value Imax.

Accordingly, the maximum amount of current fluctuation, ΔImax, that the power supply system may tolerate is equal to the maximum current value Imax minus the minimum current value Imin, that is, αImax=Imax−Imin.

As long as the amount of current fluctuation does not exceed the maximum amount of current fluctuation, ΔImax, that the power supply system may tolerate, there is no need to control the current fluctuation by performing the operation ratio control, because the power supply noise is suppressed by the decoupling capacitors, etc. of the power supply system mounted on the board or package.

More specifically, when the previous current value stored in the current evaluation unit 22 is larger than the lower limit value ILmin but smaller than the upper limit value ILmax, the amount of current fluctuation does not exceed ΔImax, whatever value the present current value may take, and therefore, there is no need to perform the operation ratio control.

Referring to FIG. 10A to FIG. 10C and FIG. 11A to FIG. 11D, the alternative example of the processing performed in the semiconductor integrated circuit according to the present embodiment will be described below. First, as illustrated in FIG. 10A to FIG. 10C, in step ST21 after activation of the chip, the operation ratio monitoring unit 21 receives the power estimating signals pes1 to pes4 from the user circuit modules 11 to 14, and outputs the operation ratio information signal pei associated with the user circuit 1.

Figure 11B:
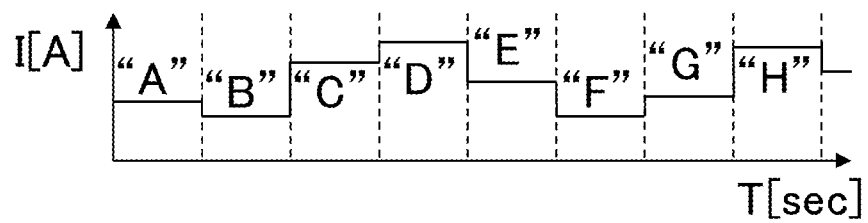

The process then proceeds to step ST22 where the current evaluation unit 22 converts the operation ratio information (pei) into current value information (pci), and stores the current value information signal pci, after which the process proceeds to step ST23. That is, the current evaluation unit 22 converts the operation ratio information signal pei into the current value information signal pci that changes from A to B to C to D, and so on, as illustrated in FIG. 11B, and stores this current value information signal pci. The processing up to this point is the same as that previously described with reference to FIG. 8.

Next, in step ST23, the current fluctuation amount judging unit 23 checks to determine whether the previous current value stored in the current evaluation unit 22 is not larger than the limit value defining the lower limit (the lower limit value) ILmin or is not smaller than the limit value defining the upper limit (the upper limit value) ILmax.

Then, the process proceeds to ST24, and if the current fluctuation amount judging unit 23 determines that the previous current value falls within the defined range, that is, the previous current value is larger than the lower limit value ILmin but smaller than the upper limit value ILmax, the process returns to ST21.

Here, the lower limit value ILmin and the upper limit value ILmax are determined based on the maximum amount of current fluctuation, ΔImax, that the power supply system may tolerate and on the minimum current value Imin and maximum current value Imax of the LSI. That is, as may be seen from the previously described FIG. 12, ILmin and ILmax are determined so that the following conditions hold.

$$IL\text{max} > I\text{min} + \Delta I\text{max}$$

$$IL\text{min} < I\text{max} - \Delta I\text{max}$$

By thus determining the lower limit value ILmin and the upper limit value ILmax, provisions may be made so as not to perform the operation ratio control when a current fluctuation occurs that is by no means likely to exceed the maximum amount of current fluctuation, ΔImax, that the power supply system may tolerate.

If the current fluctuation amount judging unit 23 determines in step ST24 that the previous current value is not larger than the lower limit value ILmin, the process proceeds to step ST25.

In step ST25, the current fluctuation amount judging unit 23 compares the difference between the previous current value (the current value of P1) stored in the current evaluation unit 22 and the present current value (the current value of P0) with the limit value. That is, the value of the register P0 is subtracted from the value of the register P1, as illustrated, for example, in FIG. 11C, and the resulting current value difference is compared with the limit value.

Then, the process proceeds to step ST26, and if the current fluctuation amount judging unit 23 determines that the current value difference is not greater than the limit value, the process returns to step ST21 to repeat the above process.

On the other hand, if it is determined in step ST26 that the current value difference is greater than the limit value, the process proceeds to step ST27 where the current fluctuation amount judging unit 23 asserts the current value difference limit exceeded signal cfe and notifies the operation ratio control unit 24 accordingly, after which the process proceeds to step ST28.

In step ST28, the operation ratio control unit 24 asserts the operation ratio control signal opc (opc1 to opc4) for the circuit modules in the user circuit 1 and thereby performs control to reduce the circuit operation ratio, after which the process proceeds to step ST29.

More specifically, in step ST28, the operation ratio control unit 24 reduces the circuit operation ratio, for example, by lowering the frequency of the clock signal or, in the case of a processor, by reducing the number of instructions to be issued simultaneously or by putting the processor in a wait state and thereby suspending the processing.

Figure 11C:
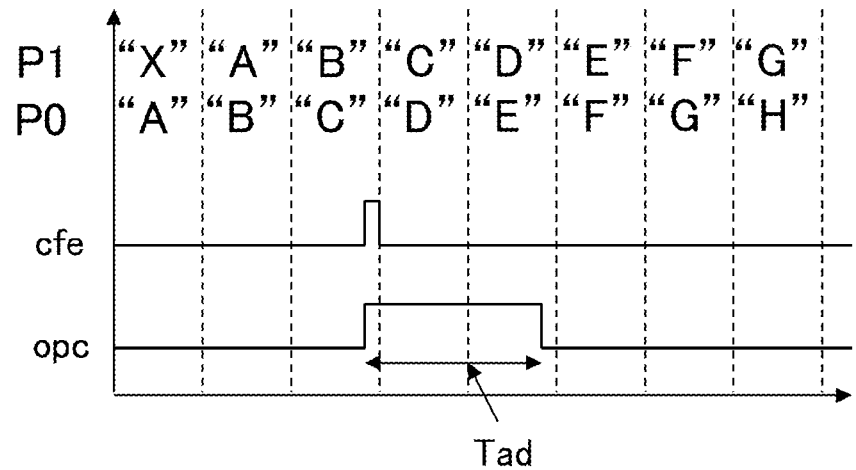

FIG. 11C illustrates the situation where the current value difference "B−C" obtained by subtracting the value "C" stored in P0 from the value "B" one section back stored in P1 exceeds the limit value, causing the current fluctuation amount limit exceeded signal cfe to rise and thus causing the operation ratio control signal opc to be driven to "H" and held at "H" for a prescribed period Tad.

In FIG. 11C, the prescribed period Tad during which the operation ratio control signal opc is held at "H" is set equal to about two-fifths of the cycle Tr of the resonant frequency of the power supply system. If the current fluctuation may be shifted from the cycle of the resonant frequency by reducing the operation ratio for the prescribed period Tad, the period may be arbitrarily set, but since the operation of the LSI is reduced for that period, it is preferable to set the period Tad as short as possible.

The circuit module whose operation ratio is reduced by the operation ratio control signal opc may not be limited to one particular circuit module, but a plurality of circuit modules may be controlled simultaneously to reduce the operation ratio.

Figure 11D:
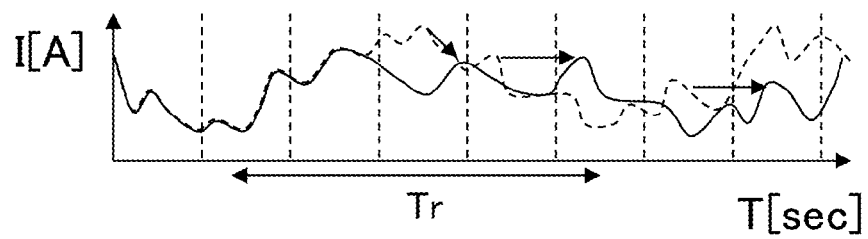

In this way, the operation ratio of the user circuit 1 is prevented from increasing, as illustrated in FIG. 11D; more specifically, by lowering the frequency of the clock signal, not only does the current consumption decrease but also the current fluctuation period is extended along the time axis and is thus shifted from the cycle Tr of the resonant frequency. That is, the current fluctuation synchronized to the cycle Tr of the resonant frequency of the power supply system does not occur, and the amount of noise is thus reduced.

Then, the process proceeds to step ST29 where the operation ratio control unit 24 negates the operation ratio control signal opc (opc1 to opc4) after a predetermined period associated with the power supply system (for example, the cycle Tr of the resonant frequency) has elapsed, and thereafter, the process returns to step ST21.

On the other hand, if the current fluctuation amount judging unit 23 determines in step ST24 that the previous current value is not smaller than the upper limit value ILmax, the process proceeds to step ST30.

In step ST30, the current fluctuation amount judging unit 23 compares the difference between the previous current value (the current value of P1) stored in the current evaluation unit 22 and the present current value (the current value of P0) with the limit value.

Then, the process proceeds to step ST31, and if the current fluctuation amount judging unit 23 determines that the current value difference is not smaller than the limit value, the process returns to step ST21 to repeat the above process.

On the other hand, if it is determined in step ST31 that the current value difference is smaller than the limit value, the process proceeds to step ST32 where the current fluctuation amount judging unit 23 asserts the current value difference limit exceeded signal cfe and notifies the operation ratio control unit 24 accordingly, after which the process proceeds to step ST33.

In step ST33, the operation ratio control unit 24 asserts the operation ratio control signal opc (opc1 to opc4) for the circuit modules in the user circuit 1 and thereby performs control to increase the circuit operation ratio, after which the process proceeds to step ST34.

In step ST34, the operation ratio control unit 24 negates the operation ratio control signal opc after a predetermined period associated with the power supply system (for example, the cycle Tr of the resonant frequency) has elapsed, and thereafter, the process returns to step ST21.

The limit value for the gradient of the current fluctuation may be determined, for example, as |ΔImax/(Tr/2)| so that the current fluctuation will not occur with the cycle Tr of the resonant frequency of the power supply system.

The above-described steps ST31 to ST34 correspond to the steps ST14 to ST17 previously described with reference to FIG. 8. As earlier described, the control performed to increase the operation ratio may be accomplished not only by disabling the clock gating, but also by suppressing the RAM chip enable control or by applying some other various known techniques.

Further, to prevent the power from increasing more than necessary, for example, it is preferable that the circuit module whose operation ratio is controlled by the operation ratio control signal opc is limited to a particular circuit in which the clock or RAM is operating when the power of the user circuit is maximum.

Since this arrangement eliminates the possibility of stopping the clock gating of any circuit whose operation ratio is low, the amount of increase in the current value due to the stopping of the clock gating may be suppressed, and it thus becomes possible to reduce the amount of increase in the maximum power.

According to the semiconductor integrated circuit of the present embodiment, by shifting the current fluctuation occurring in the circuit from the cycle of the resonant frequency of the power supply system, it becomes possible to suppress the power supply noise and reduce the chance of incurring malfunctioning of the semiconductor integrated circuit. Further, by reducing the number of decoupling capacitors to be mounted on the chip, package, or board, the cost involved with power supply noise suppression may be reduced.

Furthermore, it becomes possible to achieve a reduction in the power consumption of the semiconductor integrated circuit by actively employing power reduction techniques such as clock gating and RAM chip enable control while suppressing the power supply noise that may occur due to the implementation of these techniques. Moreover, since the power supply noise may be suppressed to low levels, the supply voltage may be further reduced, achieving a further reduction in the power consumption of the semiconductor integrated circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor integrated circuit comprising:
   a user circuit configured to include a plurality of circuit modules each containing an operation ratio control circuit; and
   a power supply noise suppression circuit operably coupled to the user circuit and configured to judge an amount of current fluctuation occurring in the user circuit by monitoring an operation ratio of each of the plurality of circuit modules, and to control, via each of the operation ratio control circuits, the operation ratio of a corresponding one of the circuit modules in accordance with a result of the judgment of the amount of current fluctuation, wherein
   the power supply noise suppression circuit comprises:
      an operation ratio monitoring unit configured to receive a signal indicating high correlation with a power value produced during operation of each of the plurality of circuit modules, and to output an operation ratio information signal carrying operation ratio information;
      a current evaluation unit configured to receive the operation ratio information signal and to output a current value information signal carrying corresponding current value information;
      a current fluctuation amount judging unit configured to receive the current value information signal and to output a current fluctuation amount limit exceeded signal indicating that the amount of current fluctuation has exceeded a fluctuation limit value; and
      an operation ratio control unit configured to receive the current fluctuation amount limit exceeded signal and to supply an operation ratio control signal to the operation ratio control circuit, wherein
   the current fluctuation amount judging unit judges whether a previous first current value in the user circuit is not larger than a first limit value defining a lower limit or is not smaller than a second limit value defining an upper limit, wherein
   when the first current value is judged to be not larger than the first limit value, the current fluctuation amount judging unit then judges whether a current value difference taken between the first current value and a present second current value is not smaller than the fluctuation limit value, and when the first current value is judged to be not smaller than the second limit value, the current fluctuation amount judging unit then judges whether the current value difference taken between the first current value and the present second current value is not greater than the fluctuation limit value.

2. The semiconductor integrated circuit according to claim 1, wherein the power supply noise suppression circuit controls the operation ratio of at least one of the circuit modules so as to shift the amount of current fluctuation from a cycle corresponding to a resonant frequency of a power supply system.

3. The semiconductor integrated circuit according to claim 1, wherein the current fluctuation amount judging unit judges whether or not a current value difference taken between a previous third current value and a present fourth current value in the user circuit has exceeded the fluctuation limit value, and when the current value difference is judged to have exceeded the fluctuation limit value, the operation ratio control unit performs control to increase the operation ratio of at least one of the circuit modules.

4. The semiconductor integrated circuit according to claim 3, wherein the operation ratio control unit performs control to increase the operation ratio of a module whose operation ratio is low among the plurality of circuit modules.

5. The semiconductor integrated circuit according to claim 3, wherein the operation ratio control unit performs control to increase the operation ratio of the at least one of the circuit modules by disabling clock gating or by suppressing RAM chip enable control.

6. The semiconductor integrated circuit according to claim 4, wherein when the current value difference is judged to be not smaller than the fluctuation limit value, the operation ratio control unit performs control to reduce the operation ratio of the at least one of the circuit modules.

7. The semiconductor integrated circuit according to claim 6, wherein the operation ratio control unit performs control to reduce the operation ratio of the at least one of the circuit modules by lowering the frequency of a clock signal or by reducing the number of instructions to be issued simultaneously from a processor or by putting the processor in a wait state and thereby suspending processing.

8. The semiconductor integrated circuit according to claim 1, wherein when the current value difference is judged to be not greater than the fluctuation limit value, the operation ratio control unit performs control to increase the operation ratio of at least one of the circuit modules.

9. The semiconductor integrated circuit according to claim 8, wherein the operation ratio control unit performs control to increase the operation ratio of a module whose operation ratio is low among the plurality of circuit modules.

10. The semiconductor integrated circuit according to claim 8, wherein the operation ratio control unit performs control to increase the operation ratio of the at least one of the circuit modules by disabling clock gating or by suppressing RAM chip enable control.

11. The semiconductor integrated circuit according to claim 1, wherein the operation ratio control unit performs control so as to shift a fluctuation cycle of current in the amount of current fluctuation from a resonant frequency range of the power supply system.

12. A method for controlling a semiconductor integrated circuit, the circuit comprising a user circuit including a plurality of circuit modules and a power supply noise suppression circuit operably coupled to the user circuit and configured to control an operation ratio of each of the circuit modules, wherein the method, using the power supply noise suppression circuit performs:

detecting a fluctuation in current value in the user circuit from the operation ratio of each of the plurality of circuit modules; and controlling the operation ratio of each of the circuit modules so as to shift the fluctuation of the current value in the user circuit from a cycle corresponding to a resonant frequency of a power supply system, wherein the controlling includes:

receiving a signal indicating high correlation with a power value produced during operation of each of the plurality of circuit modules and generating an operation ratio information signal carrying operation ratio information;

receiving the operation ratio information signal and generating a current value information signal carrying corresponding current value information;

receiving the current value information signal and generating a current fluctuation amount limit exceeded signal indicating that an amount of current fluctuation has exceeded a fluctuation limit value; and receiving the current fluctuation amount limit exceeded signal and generating an operation ratio control signal to be supplied to the operation ratio control circuit, wherein the power supply noise suppression circuit judges whether a previous first current value in the user circuit is not larger than a first limit value defining a lower limit or is not smaller than a second limit value defining an upper limit, and wherein when the first current value is not smaller than the second limit value, and when a current value difference taken between the first current value and a present second current value is not greater than the fluctuation limit value, the operation ratio of at least one of the circuit modules is increased, and when the first current value is not larger than the first limit value, and when the current value difference taken between the first current value and the present second current value is not smaller than the fluctuation limit value, the operation ratio of the at least one of the circuit modules is reduced.

13. The semiconductor integrated circuit control method according to claim 12, wherein when a current value difference taken between a previous third current value and a present fourth current value in the user circuit has exceeded the fluctuation limit value, the method performs increasing, with the power supply noise suppression circuit, the operation ratio of the at least one of the circuit modules.

14. The semiconductor integrated circuit control method according to claim 12, further comprising:

judging, with the power supply noise suppression circuit, whether or not a current value difference taken between a previous third current value and a present fourth current value in the user circuit has exceeded the fluctuation limit value, and when the current value difference is judged to have exceeded the fluctuation limit value, increasing the operation ratio of the at least one of the circuit modules.

15. The semiconductor integrated circuit control method according to claim 14, wherein the power supply noise suppression circuit increases the operation ratio of a module whose operation ratio is low among the plurality of circuit modules.

16. The semiconductor integrated circuit control method according to claim 14, the increasing increases the operation ratio of the at least one of the circuit modules by disabling clock gating or by suppressing RAM chip enable control.

* * * * *